United States Patent
Kumasaka et al.

[11] Patent Number: 5,822,498
[45] Date of Patent: Oct. 13, 1998

[54] TEACHING METHOD FOR LOADING ARM FOR OBJECTS TO BE PROCESSED

[75] Inventors: Iwao Kumasaka, Aiko-gun; Kazuhiko Usui, Yokohama, both of Japan

[73] Assignee: Tokyo Electron Limited, Tokyo-To, Japan

[21] Appl. No.: 667,799

[22] Filed: Jun. 20, 1996

[30] Foreign Application Priority Data

Jun. 22, 1995 [JP] Japan .................................. 7-179337

[51] Int. Cl.⁶ .......................... G01B 11/00; B65G 65/00
[52] U.S. Cl. ................... 395/87; 395/99; 901/3; 901/4; 318/568.13; 318/568.14; 414/786; 414/416; 356/400
[58] Field of Search ........................... 395/87, 99; 901/3, 901/4; 318/568.13, 568.14; 414/786, 416; 356/400

[56] References Cited

U.S. PATENT DOCUMENTS

| | | | |
|---|---|---|---|
| 4,770,590 | 9/1988 | Hugues et al. | 414/172 |
| 5,030,057 | 7/1991 | Nishi et al. | 414/786 |
| 5,044,752 | 9/1991 | Thurfjell et al. | 356/400 |
| 5,162,047 | 11/1992 | Wada et al. | 29/25.01 |
| 5,409,348 | 4/1995 | Suzuki | 414/786 |
| 5,626,456 | 5/1997 | Nishi | 414/404 |

FOREIGN PATENT DOCUMENTS

| | | |
|---|---|---|
| 58-60552 | 4/1983 | Japan . |
| 58-60553 | 4/1983 | Japan . |
| 60-171723 | 9/1985 | Japan . |
| 63-24615 | 2/1988 | Japan . |
| 63-260016 | 10/1988 | Japan . |
| 3-244121 | 10/1991 | Japan . |

Primary Examiner—George B. Davis
Attorney, Agent, or Firm—Beveridge, DeGrandi, Weilacher & Young, LLP

[57] ABSTRACT

The invention relates to a teaching method for instructing relative proximity locations to a loading arm that is used for loading objects to be processed in to or out of a support boat, the support boat being provided with a plurality of support portions for supporting the objects to be processed at a predetermined pitch along the length thereof. With this teaching method the loading arm is moved manually into the vicinity of one of the plurality of support portions that is positioned at an uppermost end of the support boat, a support portion positioned at a lowermost end thereof, and at least one support portion other than the two support portions; obtaining three-dimensional coordinates thereof; and these three-dimensional coordinates are stored in a storage portion. The three-dimensional coordinates for each of the others of the support portions are then derived on the basis of these stored values. This makes it possible to accurately derive the three-dimensional coordinates of all of the support portions in practice, even at locations where the boat itself has become deformed.

8 Claims, 4 Drawing Sheets

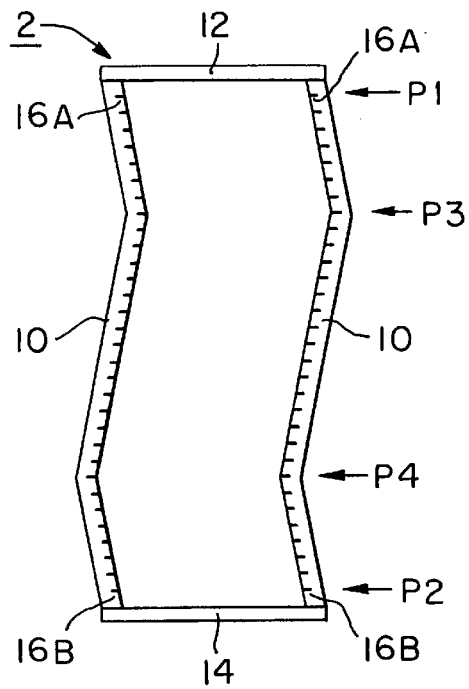
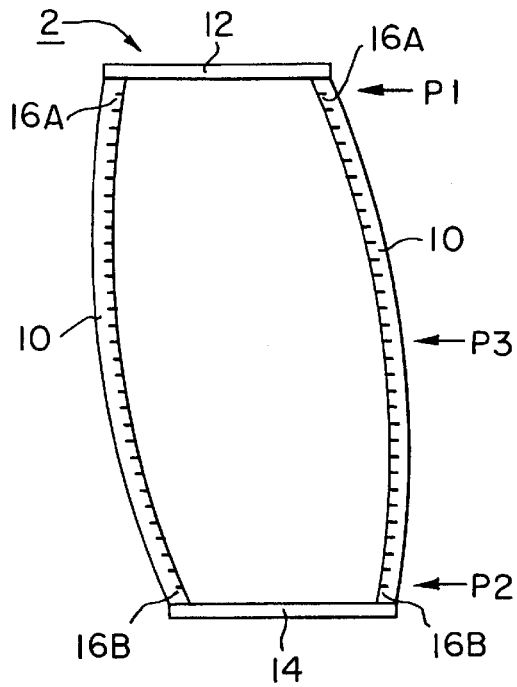
FIG. 4A  FIG. 4B
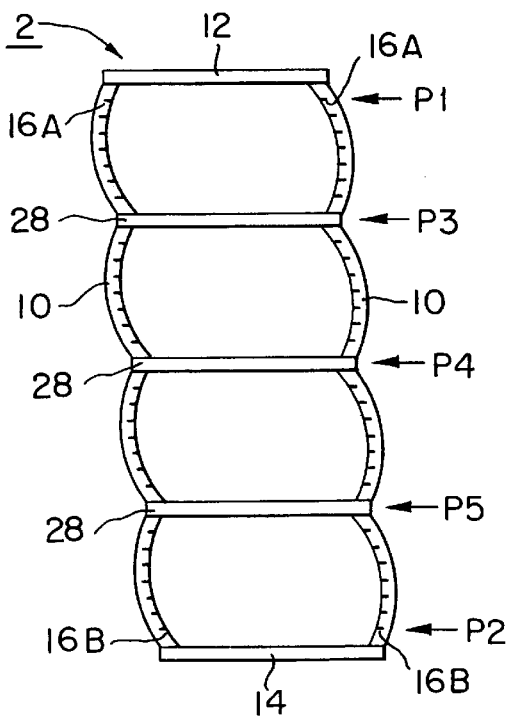
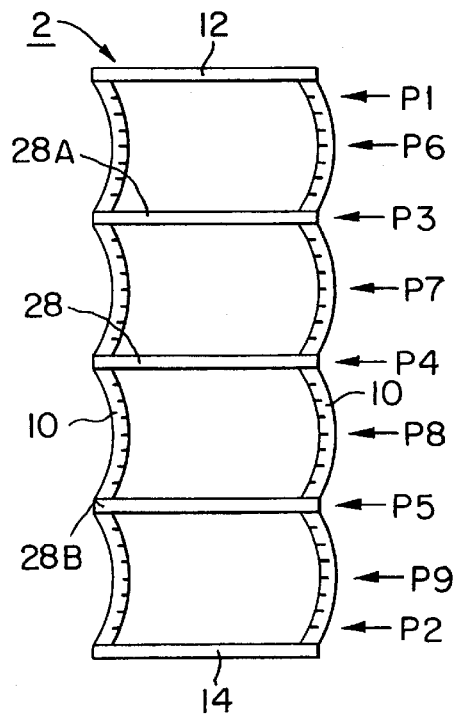
FIG. 4C  FIG. 4D

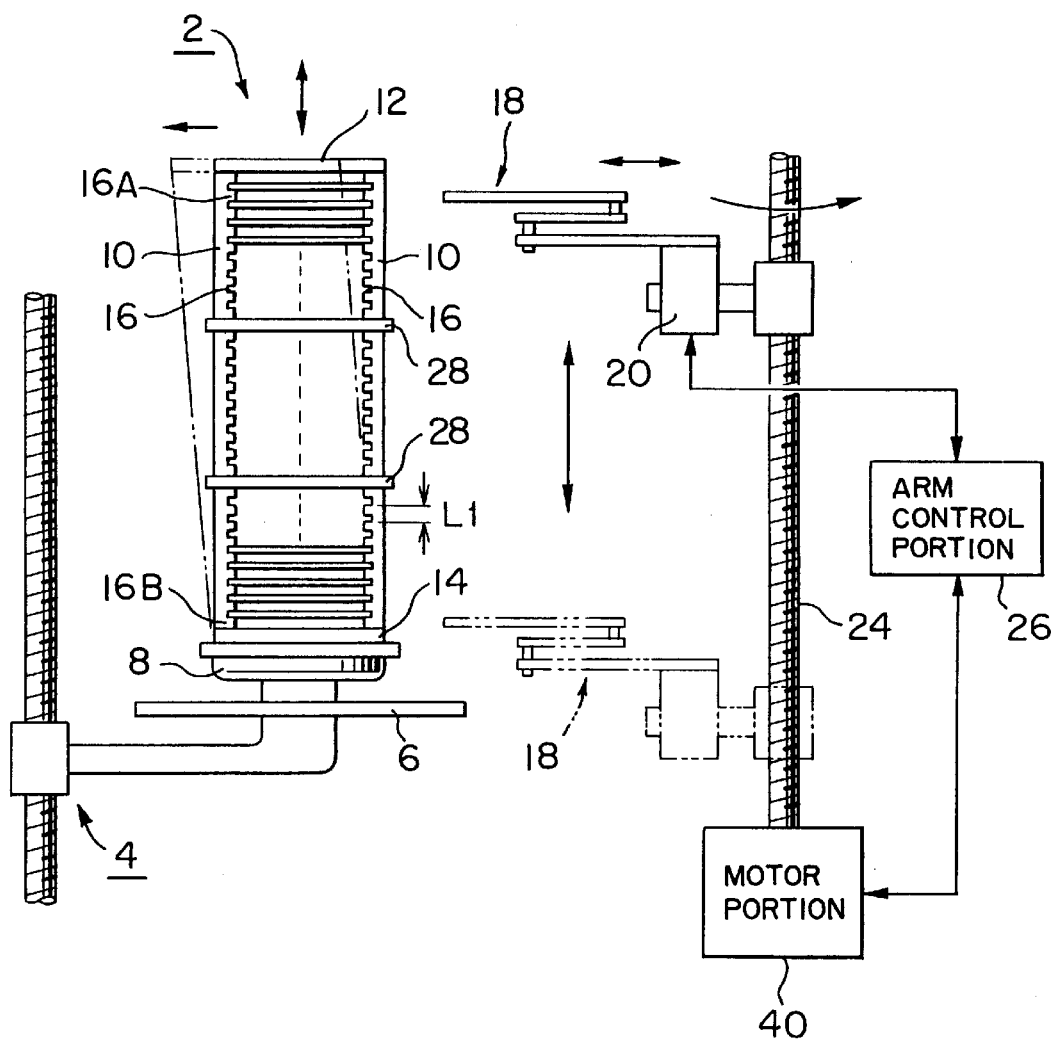
F I G. 5

TEACHING METHOD FOR LOADING ARM FOR OBJECTS TO BE PROCESSED

BACKGROUND OF THE INVENTION

The present invention relates to a teaching method used when a loading arm is made to approach a support boat (wafer boat) that holds objects to be processed such as semiconductor wafers.

In the conventional art, various thermal processes are generally implemented for fabricating semiconductor integrated circuitry, such as the formation of oxide films on the semiconductor wafers, the diffusion of impurities, and the formation of thin films by chemical vapor deposition (CVD). A vertical thermal processing apparatus is mainly used for these thermal processes.

In a vertical thermal processing apparatus of this type, a large number of wafers are subjected to thermal processing at the same time to increase the throughput. A support boat in which wafers are loaded in a vertical stack at a predetermined pitch is usually used to achieve this.

An example of a support boat that is generally used in the art is shown in FIG. 5. In this case, a support boat 2 is mounted vertically on a quartz insulating tube 8 placed on a mounting stand 6 that is raised and lowered by a boat elevator mechanism 4 configured of means such as a ball screw. The support boat 2 is configured of a plurality of support columns 10, such as four support columns 10, with both ends thereof being fixed together by an upper plate 12 and a lower plate 14. Support portions 16 that define mounting grooves are formed at a predetermined pitch L1 along the inner side of each support column 10 in the lengthwise (vertical) direction thereof. The configuration is such that the peripheral edges of several dozen wafers W are supported by these support portions 16 so that the wafers are held in a vertical stack. A material that has an excellent thermal resistance, such as high-purity quartz or silicon carbide (SiC), is used for the various members of this support boat 2.

The pitch L1 of the support portions 16 that define the mounting grooves is formed to be extremely close, such as of the order of 7 mm to 10 mm, and approximately 100 to 150 wafers can be held in a vertical stack by the entire boat. If necessary, quartz reinforcing members 28 are provided at suitable positions along the lengthwise direction of the boat 2, to prevent distortion but not obstruct the wafers.

A loading arm 18 for loading the wafers W in to and out of the support boat 2 is formed as a jointed arm that is free to extend, and is driven by a motor portion 20 to enable it to extend and swivel. A base 22 of the arm 18 is attached to an arm elevator mechanism 24 configured of means such as a ball screw. The loading arm 18 is capable of moving vertically over the entire heightwise direction of the boat 2 and it can be located at any desired position in the heightwise direction of the boat 2 in order to load the wafers. This apparatus is also configured in such a manner that wafers within a wafer cassette (not shown in the figures) can be removed by the same arm 18 and are afforded a soft landing with respect to the support portions 16.

The actions of this loading arm 18 are controlled by an arm control means 26 that is a microprocessor or the like, but before these actions start, a teaching operation is performed to ensure that the loading arm 18 can access the wafers in a highly accurate manner, in close proximity with the support portions 16 of the support boat 2. This teaching operation is implemented in a similar manner to that used for a welding robot mechanism, and uses a method in which the arm 18 is moved in a teaching mode to a position at which it can access the wafers and the three-dimensional coordinates of that point are stored. However, such a teaching operation is extremely difficult with a support boat 2 because it has to be repeated approximately 150 times with respect to each of the support portions 16 that are arranged in a vertical stack. It is also likely that an access error will occur at some point during the 150 repeats.

In such a case, the loading arm 18 is not made to access each of the support portions 16; it is brought manually into proximity with an uppermost support portion 16A and a lowermost support portion 16B, and the three-dimensional coordinates of those two positions are stored. In the conventional art, teaching is enabled by dividing the distance between those two points by the number of support portions 16 existing therebetween, such as 148, to derive the three-dimensional coordinates of the remaining support portions (148 support portions in this example). The actual movements of the loading arm 18 are controlled on the basis of the thus obtained three-dimensional coordinates.

Unfortunately, this method of obtaining actual measurements of the three-dimensional coordinates of uppermost and lowermost support portions and then calculating the coordinates of the other support portions is based on the assumption that the support boat 2 does not deform and it remains vertical.

However, although quartz and SiC have superior thermal resistances, repeated exposure to temperatures of approximately 1200° C. during processing causes a small amount of deformation. In particular, as wafer sizes increase from six inches to eight inches, the weight of 150 wafers becomes pretty large, and this tends to increase the amount of deformation of the boat further.

This would not cause a problem if it were possible to predict the deformation with some sort of rule. However, such deformation usually appears at weak points of the boat. Moreover, these weak points cause various different types of deformation in different boats in practice, such as bending of the entire support columns of the boat or inclination in one direction. For example, depending on the length of the entire support boat, the support columns could deform by up to 5 mm. An example of such deformation of the boat is shown by broken lines in FIG. 5.

Thus, with the above described teaching method that references the three-dimensional coordinates of two points, the actual three-dimensional coordinates of the support portions of the support boat could vary widely from the calculated three-dimensional coordinates, which could lead in the worst case to a situation in which the wafers W fall out of the support boat.

SUMMARY OF THE INVENTION

The present invention was devised in the light of the above described problem with the conventional art teaching method and proposes a solution therefor. The objective of this invention is to provide a teaching method for a loading arm by which accurate coordinates can be obtained for each of the support portions by obtaining three-dimensional coordinates of at least three points (so-called deformation joints) corresponding to deformation of the support boat, to use as reference coordinates.

To solve the above problem, the present invention relates to a teaching method for instructing relative proximity locations to a loading arm that is used for loading objects to be processed in to or out of a support boat, the support boat being provided with a plurality of support portions for supporting the objects to be processed at a predetermined pitch along the length thereof, wherein this teaching method for a loading arm comprises a step of manually moving the loading arm into the vicinity of a support portion amongst the plurality of support portions that is positioned at an uppermost end of the support boat, a support portion positioned at a lowermost end thereof, and at least one support portion other than the two support portions; obtaining three-dimensional coordinates thereof; and storing the three-dimensional coordinates in a storage portion. Three-dimensional coordinates are then calculated for each of the others of the support portions on the basis of the thus stored values.

Since the method of this invention is configured to obtain actual measurements by manual means of the three-dimensional coordinates of at least three points, of the support portions at the upper and lower ends of the support boat and a support portion at at least one intermediate point, to act as reference point, the three-dimensional coordinates of the other support portions can be calculated accurately even if the support boat has deformed. Thus positions can be set to accommodate deformation of the support boat.

By positioning the arm at a support portion that is located at a deformation joint of the support boat or a support portion located corresponding to a reinforcing member (if the boat is provided with such members), and obtaining actual measurements of the three-dimensional coordinates thereof, this invention makes it possible to obtain even more accurate three-dimensional coordinates of the other support portions.

BRIEF DESCRIPTION OF THE DRAWINGS

FIGS. 4A, 4B, 4C and 4D are schematic views of deformation states of the wafer support boat of FIG. 2, indicating detection points for reference coordinates on the support boat; and FIG. 5 is a diagram illustrative of the teaching method for a loading arm used in the prior art.

DETAILED DESCRIPTION OF THE PREFERRED EMBODIMENTS

A preferred embodiment of a teaching method for a loading arm in accordance with the present invention will be described below with reference to the accompanying figures.

Figure 1:
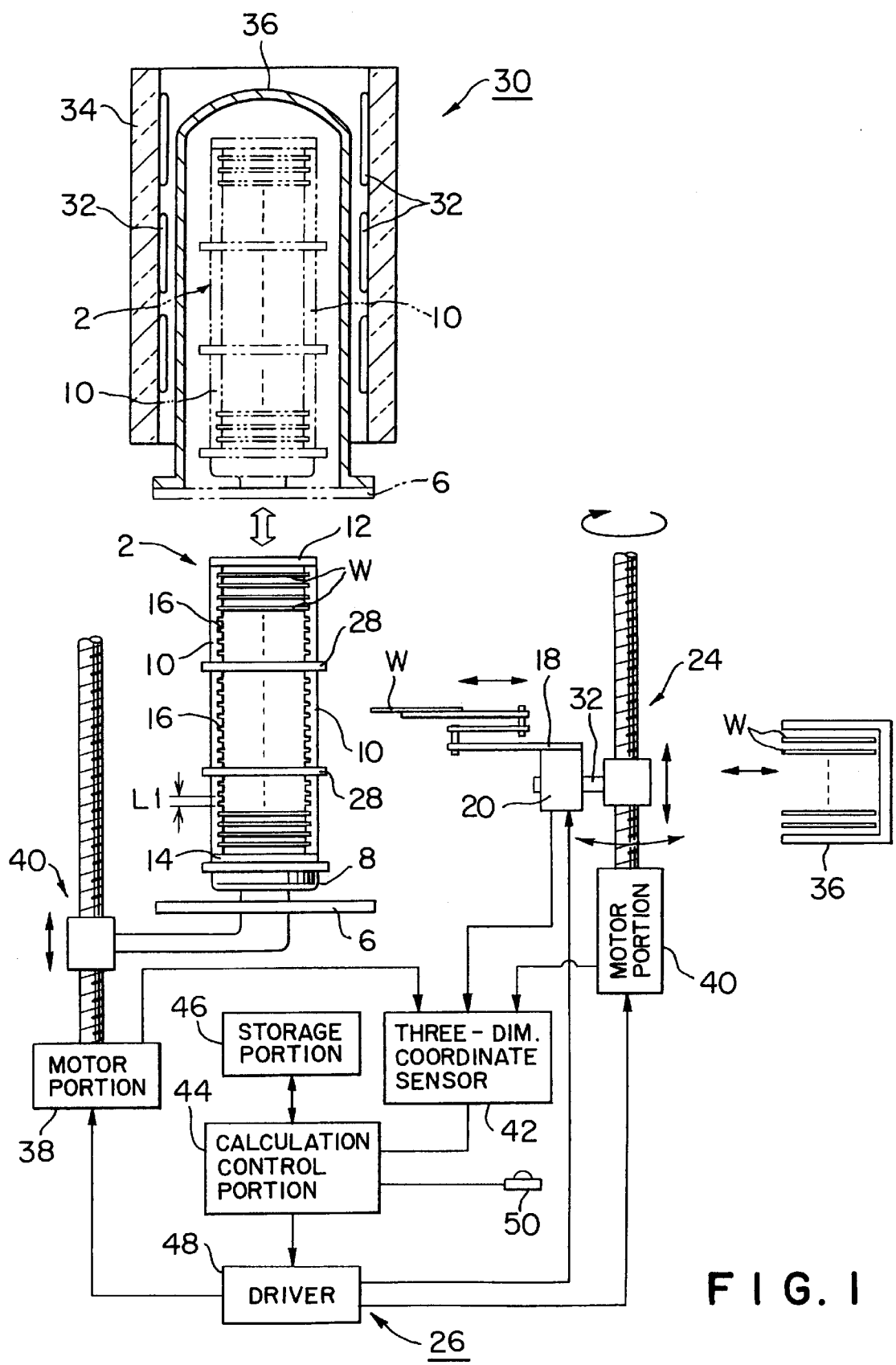
FIG. 1 is a diagram of the entire structure of a vertical thermal processing apparatus provided with a loading arm to which the teaching method of this invention is applied.
Figure 2:
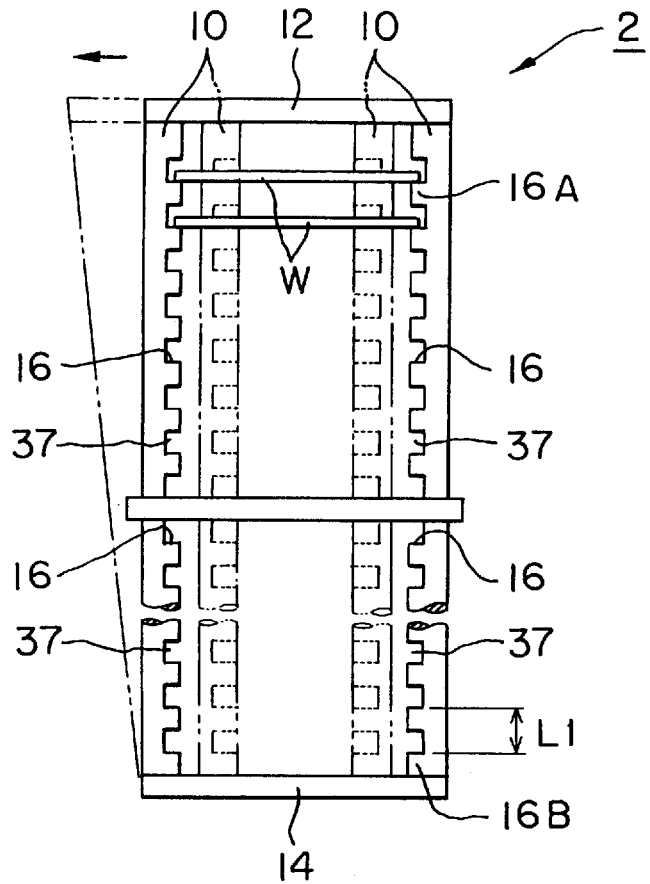
FIG. 2 is a lateral view of a wafer support boat used in the vertical thermal processing apparatus of FIG. 1.
Figure 3:
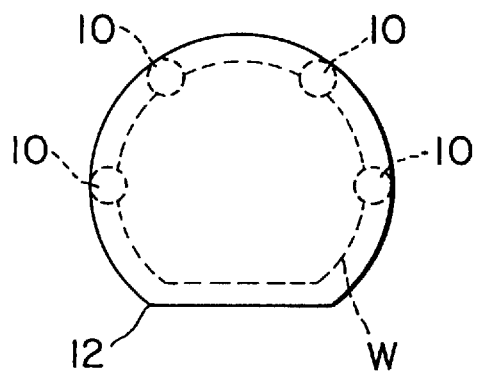
FIG. 3 is a plan view of the wafer support boat of FIG. 2.

A diagram of the entire structure of the vertical thermal processing apparatus which is provided with this loading arm is shown in FIG. 1, a side view of the support boat thereof is shown in FIG. 2, and a plan view of this support boat is shown in FIG. 3. Note that components in these figures that are the same as those of the vertical thermal processing apparatus of FIG. 5 are given the same reference numbers.

First of all, a vertical thermal processing apparatus 30 is provided with a processing vessel (process tube) 36 that is surrounded by a heater 32 and thermal insulation 34. This processing vessel 36 is formed in a circular cylindrical shape of a material with excellent thermal resistance, such as quartz, and is open at a lower end.

A support boat (wafer boat) 2 holding a large number of semiconductor wafers W that are objects to be processed is raised up from below into the processing vessel 36 and is accommodated therein.

This support boat 2 is mounted vertically on a quartz insulating tube 8 placed on a mounting stand 6 that is raised and lowered by a boat elevator mechanism 4 configured of means such as a ball screw. The mounting stand 6 also functions as a lid to seal the lower edge opening of the processing vessel 36.

The support boat 2 is configured of a plurality of vertical support columns 10 (in this embodiment there are four) with both ends thereof being fixed together by an upper plate 12 and a lower plate 14. Support portions 16 that define mounting grooves 37 are formed at a predetermined pitch L1 along the inner side of each support column 10 in the lengthwise (vertical) direction thereof. The configuration is such that each wafer W is supported by these support portions 16 at four points around the peripheral edge thereof. A material that has an excellent thermal resistance, such as high-purity quartz or silicon carbide (SiC), is used for the various members of this support boat 2.

The pitch L1 of the support portions 16 that define the wafer mounting grooves is formed to be extremely close, such as of the order of 7 mm to 10 mm, and approximately 100 to 150 wafers can be held in a vertical stack by the entire support boat. Quartz reinforcing members 28 are also provided at suitable positions along the lengthwise direction of the boat 2, to prevent distortion but not obstruct the wafers stacked. Note that the reinforcing members 28 are provided only out of necessity; they are not needed if the dimensions of the support boat 2 are small.

A loading arm 18 for loading the wafers W in to and out of the support boat 2 is formed as a jointed arm that is free to extend and swivel, and is driven by a motor portion 20 to enable it to extend and swivel. A base 22 of the loading arm 18 is attached to an arm elevator mechanism 24 configured of means such as a ball screw. The loading arm 18 is capable of moving vertically over the entire heightwise direction of the boat 2 and it can be located at any desired position in the heightwise direction of the boat 2 in order to load the wafers. This apparatus is also configured in such a manner that wafers within a wafer cassette (not shown in the figures) are removed by the same arm 18 and are afforded a soft landing with respect to the support portions 16.

The actions of the above described boat elevator mechanism 4, the motor portion 20 for the arm, and the arm elevator mechanism 24 are placed under the control of an arm control means 26 that is, for example, a microprocessor. This arm control means 26 comprises a three-dimensional coordinate sensor 42 connected to each of a motor portion 38 with an encoder for the boat elevator mechanism 4, the motor portion 20 with an encoder for the arm, and a motor portion 40 with an encoder for the arm elevator mechanism 24. The arm control means 26 further comprises a calculation control portion 44, a storage portion 46 for storing calculation results therefrom, and a driver 48 for driving each of the motor portions 20, 38, and 40.

The calculation control portion 44 is programmed with two modes: a teaching mode and an ordinary operating mode. In teaching mode, the loading arm 18 is moved manually to a preferred location and that location is detected and stored as three-dimensional coordinates by pressing a set button 50. The operation is such that equidistant positional coordinates are derived by calculation with reference to the thus stored three-dimensional coordinates. In other words, the positional coordinates of each of the support portions are obtained by calculations. In the ordinary operating mode, the loading arm 18 actually moves on the basis of the three-dimensional coordinates obtained as described above, to load wafers into the support boat 2.

The description now turns to the method of teaching the loading arm of this invention on the basis of the apparatus configured as described above.

First of all, the quartz of the support boat 2, even though it has superior thermal resistance characteristics, is exposed many times to high processing temperatures on the order of 1200° C. as the thermal processing of the semiconductor wafers W is repeated a certain number of times, and thus it will deform to a certain extent under these processing temperatures and the weight of the wafers themselves. This deformation manifests itself in many forms, such as deformation, bending, and twisting of the support columns 10 of the boat, so that uniform and non-uniform shapes are generated in the heightwise, horizontal, and (θ) (rotational) directions of the boat. However, it is extremely difficult to predict these deformations.

Therefore, repeated use of the support boat 2 will make it necessary to correct and re-set the coordinate positions of the support portions 16 that are in direct contact with the wafers in the support boat 2, every time it is considered that they might have become deformed to a certain degree. It will also be necessary to re-instruct the access position of the loading arm 18 with respect to the support boat 2 when the thermal processing apparatus starts up for the first time.

In such a case, the conventional art method involves manually accessing only the uppermost and lowermost support portions 16A and 16B of the support boat 2 shown in FIG. 2 to detect the three-dimensional coordinates thereof, as described above, and the coordinates of the other support portions are derived by calculations therefrom. However, it is not possible to allow for deformation of the boat 2 with this method, and thus there is a fear that the wafers will fall from the support boat 2.

The teaching method for a loading arm in accordance with this invention detects the three-dimensional coordinates of at least one support portion in addition to the uppermost support portion 16A and the lowermost support portion 16B. In other words, it references the three-dimensional coordinates of at least three locations over the entire length of the boat, so that deformation of the boat can be allowed for when these coordinates are used as reference to calculate the coordinates of the other support portions.

The description now turns to the detection of three-dimensional coordinates in support boats in various deformed states, as shown in FIGS. 4A to 4D.

FIG. 4A shows a deformation state of a support boat 2 that is not provided with reinforcing members, where the support columns 10 bend at two locations along the length thereof. Note that the term "deformation joint" used hereinafter is defined as a point at which there is a sudden change in the angle or curvature of a deforming support column 10. In the deformation shown in FIG. 4A, two points P3 and P4 act as deformation joints. Therefore, this method detects the three-dimensional coordinates at a total of four locations: the support portions 16 corresponding to these two deformation joints P3 and P4, a location P1 of the uppermost support portion 16A, and a location P2 of the lowermost support portion 16B.

First of all, the calculation control portion 44 of FIG. 1 is placed in teaching mode, then the loading arm 18 is moved manually to access each of these points P1 to P4 in sequence and highly accurately. At each point, the set button 50 is pressed. Thus, when the arm is positioned at each of the points P1 to P4, the coordinate position at that time is fetched into the three-dimensional coordinate sensor 42 from the encoders for each of the motor portions 20, 38, and 40.

The calculation control portion 44 uses the thus obtained four sets of three-dimensional coordinates as reference values and divides each distance between coordinates into uniform parts, by dividing each distance by the number of support portions 16 therein. Thus the positional coordinates of the other support portions 16 can be obtained.

Since the positions of the deformation joints P3 and P4 are used as reference coordinates in this case, it is possible to obtain the positional coordinates of support portions located between a support portion at a deformation joint and either the uppermost or lowermost end of the boat, to a high degree of accuracy, and thus allow for deformation of the boat. The thus detected three-dimensional coordinates and the three-dimensional coordinates derived by calculations therefrom are stored in the storage portion 46.

Thus, when teaching mode ends and ordinary operating mode starts, the loading arm 18 is able to access the boat in order to load the wafers, on the basis of the coordinates of each of the support portions that have been stored in the storage portion 46 in the above described manner.

In another deformation state shown in FIG. 4B, the upper plate 12 and lower plate 14 are displaced laterally and, in addition, each of the support columns 10 is bent outward to form a drum-like shape. In this deformation state, the amount of deformation is at a maximum at substantially the center of the lengthwise (vertical) direction of the support columns 10, at a point P3. Therefore, a method similar to that described above is used to detect the three-dimensional coordinates of the support portion at this point P3 at substantially the center of the boat, in addition to the point P1 of the uppermost support portion 16A and the point P2 of the lowermost support portion 16B, for use as reference coordinates.

A deformation state of a support boat provided with three intermediate reinforcing members 28 is shown in FIG. 4C. In this case, the reinforcing members 28 that restrict deformation themselves act as joints for deformation, so that the deformation of the support columns between the reinforcing members 28 and between each of the reinforcing members 28 and either the upper plate 12 or the lower plate 14 is substantially uniform. With this type of deformation, a method similar to that described above is used to detect the three-dimensional coordinates of three support portions at points P3, P4, and P5 corresponding to the reinforcing members 28, in addition to the point P1 of the uppermost support portion 16A and the point P2 of the lowermost support portion 16B, for use as reference coordinates.

Another deformation state of a support boat provided with the same three intermediate reinforcing members 28 as those in FIG. 4C is shown in FIG. 4D. In this case, the deformation of each support column 10 between reinforcing members 28 and between each of the reinforcing members 28 and either the upper plate 12 or the lower plate 14 is not uniform.

If the same teaching method as that for FIG. 4C were used in this case, the amount of error at substantially central portions between the reinforcing members 28 would become so large, there would be a danger of wafers falling out of the support boat 2. In this case, a similar method could be used to detect the three-dimensional coordinates of two points P7 and P8 at substantially the centers between adjacent reinforcing members 28, a point P6 at substantially the center between the uppermost support portion 16A and an uppermost reinforcing member 28A, and a point P9 at substantially the center between the lowermost support portion 16B and a lowermost reinforcing member 28B, in addition to the points P1 to P5 of FIG. 4C, for use as reference coordinates.

Thus, when teaching of the loading arm is being performed in accordance with this embodiment of the present invention, three-dimensional coordinates of at least one support portion other than the support portions at the upper and lower ends of the support boat are used as reference to calculate the coordinates of the other support portions. This makes it possible to determine the coordinates with high positional accuracy even when the support boat deforms.

It should be noted that the above described deformation states and the method used to obtain the reference coordinates are merely used as examples. It should be obvious to those skilled in the art that reference coordinates could be detected at various other locations to correspond with the deformation of the boat.

Similarly, the wafer support portions could be configured by cutting grooves into the support columns, but the present invention is not limited to such a form of support portion and can be applied to various other types of support portion such as annular support portions.

The above described teaching method for a loading arm in accordance with the present invention makes it possible to achieve the effects discussed below.

When teaching of the loading arm is being performed, the three-dimensional coordinates of at least three positions are detected, corresponding to support portions at the upper and lower ends of the support boat and at least one other support portion at an intermediate position. The coordinates of the other support portions are derived by calculations using the detected coordinates as reference. Thus, the coordinates of all the support portions can be derived in practice both simply and accurately, even if the support boat deforms. Therefore, the occurrence of faults such as errors in the loading of objects to be processed can be greatly suppressed.

Obtaining the three-dimensional coordinates of a support portion at a deformation joint of the support boat or at a reinforcing member (if the boat is provided with such members) as reference coordinates makes it possible to derive the actual coordinates of the other support portions to a greater degree of accuracy.

What is claimed is:

1. A teaching method for instructing relative proximity locations to a loading arm that is used for loading objects to be processed in to or out of a support boat, said support boat being provided with a plurality of support portions for supporting said objects to be processed at a predetermined pitch along the length thereof, wherein said teaching method for a loading arm comprises the steps of:

manually moving said loading arm into the vicinity of an uppermost support portion positioned at an uppermost end of said support boat, a lowermost support portion positioned at a lowermost end of said support boat, and at least one intermediate support portion other than said uppermost and said lowermost support portions;

obtaining three-dimensional coordinates of each of said uppermost portion, said lowermost portion, and said at least one intermediate support portion;

storing three-dimensional coordinates obtained by said obtaining step in a storage portion; and calculating three-dimensional coordinates for other support portions of said boat on the basis of said stored coordinates by deriving three-dimensional coordinates of all support portions that are equidistant between one of said uppermost and said lowermost support portions and said at least one intermediate support portion whereby said loading arm moves on the basis of said three-dimensional coordinates thus derived to load said objects to be processed into said support boat.

2. The teaching method for a loading arm of claim 1, wherein said at least one intermediate support portion is positioned at a deformation joint of said support boat.

3. The teaching method for a loading arm of claim 1, wherein said calculating three-dimensional coordinates by deriving step comprises dividing a distance between said one of said uppermost and said lowermost support portions and said at least one intermediate support portion by the number of other support portions therebetween.

4. The teaching method for a loading arm of claim 3, wherein said plurality of support portions includes another intermediate support portion and said calculating three-dimensional coordinates by deriving step comprises dividing a distance between said at least one intermediate support portion and said another intermediate support portion by the number of other support portions therebetween.

5. A teaching method for instructing relative proximity locations to a loading arm that is used for loading objects to be processed in to or out of a support boat, said support boat being provided with a plurality of support portions for supporting said objects to be processed at a predetermined pitch along the length thereof and being also provided with intermediate reinforcing members for preventing deformation, wherein said teaching method for a loading arm comprises the steps of:

manually moving said loading arm into the vicinity of an uppermost support portion positioned at an uppermost end of said support boat, a lowermost support portion positioned at a lowermost end of said support boat, and a corresponding support portion positioned to correspond with one of said reinforcing members;

obtaining three-dimensional coordinates of each of said uppermost portion, said lowermost portion, and said corresponding support portion;

storing three-dimensional coordinates obtained by said obtaining step in a storage portion; and calculating three-dimensional coordinates for other support portions of said boat on the basis of said stored coordinates by deriving three-dimensional coordinates of all support portions that are equidistant between one of said uppermost and said lowermost support portions, and said corresponding support portion whereby said loading arm moves on the basis of said three-dimensional coordinates thus derived to load said objects to be processed into said support boat.

6. The teaching method for a loading arm of claim 5, wherein said support portions that said loading arm is moved manually into proximity with comprise a support member positioned at substantially a central portion between said reinforcing members, and a support member positioned at substantially a central portion between an upper end of said support boat and an uppermost reinforcing member.

7. The teaching method for a loading arm of claim 3, wherein said calculating three-dimensional coordinates by deriving step comprises dividing a distance between said one of said uppermost and said lowermost support portions, and said corresponding support portion by the number of other support portions therebetween.

8. The teaching method for a loading arm of claim 7, wherein said plurality of support portions includes another corresponding support portion and said calculating three-dimensional coordinates by deriving step comprises dividing a distance between said at least one corresponding support portion and said another corresponding support portion by the number of other support portions therebetween.

* * * * *